(12) United States Patent
Lee

(10) Patent No.: US 7,073,012 B2
(45) Date of Patent: Jul. 4, 2006

(54) SYSTEM AND METHOD FOR INTERLEAVING DATA IN A COMMUNICATIONS DEVICE

(75) Inventor: Tak K Lee, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 248 days.

(21) Appl. No.: 10/647,526

(22) Filed: Aug. 26, 2003

(65) Prior Publication Data
US 2005/0050284 A1    Mar. 3, 2005

(51) Int. Cl.
*G06F 12/06* (2006.01)
*H03M 13/00* (2006.01)

(52) U.S. Cl. .................... 711/5; 711/157; 714/752; 714/762

(58) Field of Classification Search .................. 711/5, 711/157
See application file for complete search history.

(56) References Cited

U.S. PATENT DOCUMENTS

| | | | |
|---|---|---|---|
| 5,063,553 A | 11/1991 | Erhart et al. | |
| 5,737,337 A | 4/1998 | Voita et al. | |
| 5,828,671 A | 10/1998 | Vela et al. | |
| 6,118,745 A | 9/2000 | Hutchins et al. | |
| 2002/0062464 A1* | 5/2002 | Park et al. | 714/701 |
| 2002/0188905 A1* | 12/2002 | Hollums | 714/752 |

OTHER PUBLICATIONS

Bernard Skylar, "Digital Communications Fundamentals and Applications", 2001, pp. 461-469, 2nd Ed., Prentice Hall PTR.

* cited by examiner

*Primary Examiner*—Jack A. Lane
(74) *Attorney, Agent, or Firm*—Sterne Kessler Goldstein & Fox PLLC

(57) ABSTRACT

A system and method is provided for interleaving data in a communications device. The system includes a memory for storing symbols of a data block, a read module and a write module, each of which is coupled to the memory. The system also includes a interleaving logic module coupled to the read and write modules. The interleaving logic module determines an interleaving sequence comprising a sequence of memory addresses. Each memory address is then communicated sequentially to the read and write modules. When the read module receives the address, the read module reads the stored data symbol. When the write module receives the address, the write module writes a symbol from a next data block to the vacated address. The interleaving logic module repeats these steps until every symbol of the stored block has been read and every symbol of the next data block has been written to memory.

20 Claims, 9 Drawing Sheets

|       |       |     |          |
|-------|-------|-----|----------|
| $X_{1N}$ | $X_{2N}$ | ... |          |
| ⋮     | ⋮     |     |          |
| $X_{1k}$ | $X_{2k}$ | ... | $X_{Mk}$ |
| ⋮     | ⋮     |     |          |
| $X_{12}$ | $X_{22}$ | ... | $X_{M2}$ |
| $X_{11}$ | $X_{21}$ | ... | $X_{M1}$ |

FIG. 2
RELATED ART

| $A_0$ | $A_1$ | $A_2$ | 0 |
|---|---|---|---|
| $A_3$ | $A_4$ | $A_5$ | 0 |
| 0 | 0 | 0 | 0 |

| 0   A$_0$ | 1   A$_1$ | 2   A$_2$ | 3   A$_3$ |
|---|---|---|---|
| 4   A$_4$ | 5   A$_5$ | 6   A$_6$ | 7   A$_7$ |
| 8   A$_8$ | 9   A$_9$ | 10   A$_{10}$ | 11   A$_{11}$ |

| 0   B$_0$ | 1   B$_3$ | 2   B$_6$ | 3   B$_9$ |
|---|---|---|---|
| 4   B$_1$ | 5   B$_4$ | 6   B$_7$ | 7   B$_{10}$ |
| 8   B$_2$ | 9   B$_5$ | 10   B$_8$ | 11   B$_{11}$ |

| 0     | 1     | 2     | 3     |
|-------|-------|-------|-------|
| $C_0$ | $C_9$ | $C_7$ | $C_5$ |
| 4     | 5     | 6     | 7     |
| $C_3$ | $C_1$ | $C_{10}$ | $C_8$ |
| 8     | 9     | 10    | 11    |
| $C_6$ | $C_4$ | $C_2$ | $C_{11}$ |

| 0     | 1     | 2     | 3        |
|-------|-------|-------|----------|
| $D_0$ | $D_7$ | $D_3$ | $D_{10}$ |
| 4     | 5     | 6     | 7        |
| $D_6$ | $D_2$ | $D_9$ | $D_5$    |
| 8     | 9     | 10    | 11       |
| $D_1$ | $D_8$ | $D_4$ | $D_{11}$ |

FIG. 7D

SYSTEM AND METHOD FOR INTERLEAVING DATA IN A COMMUNICATIONS DEVICE

FIELD OF THE INVENTION

The present invention is generally related to communication networks. More particularly, the present invention is related to systems and methods for interleaving data in communication devices.

BACKGROUND OF THE INVENTION

Modern communications systems, particularly wireless systems and cable modem systems, are subject to intermittent, random bursts of noise and interference. When such bursts occur, errors may be introduced into packets of data transmitted over the system. These errors typically affect multiple consecutive symbols of transmitted data. One common technique to minimize the impact of burst errors on a communication channel is to interleave the sequence of data symbols to be sent before its transmission. Interleaving is the process of separating consecutive data symbols and reordering the symbols for transmission. This technique distributes the impact of burst errors across a data sequence in a data transmission allowing for more effective error correction.

A block interleaver is a simple, yet effective, type of interleaver. A block interleaver writes received data symbols in a row-wise fashion in memory and then reads the symbols in a column-wise fashion to generate the interleaved sequence of data for transmission. A conventional block interleaver 110 is shown in FIG. 1. The interleaver 110 comprises a write module 120 which receives data symbols, a memory 130, and a read module 140 which reads the symbols from memory 130 in an interleaved fashion. Memory 130 may be partitioned into one or more sections.

Figure 2:
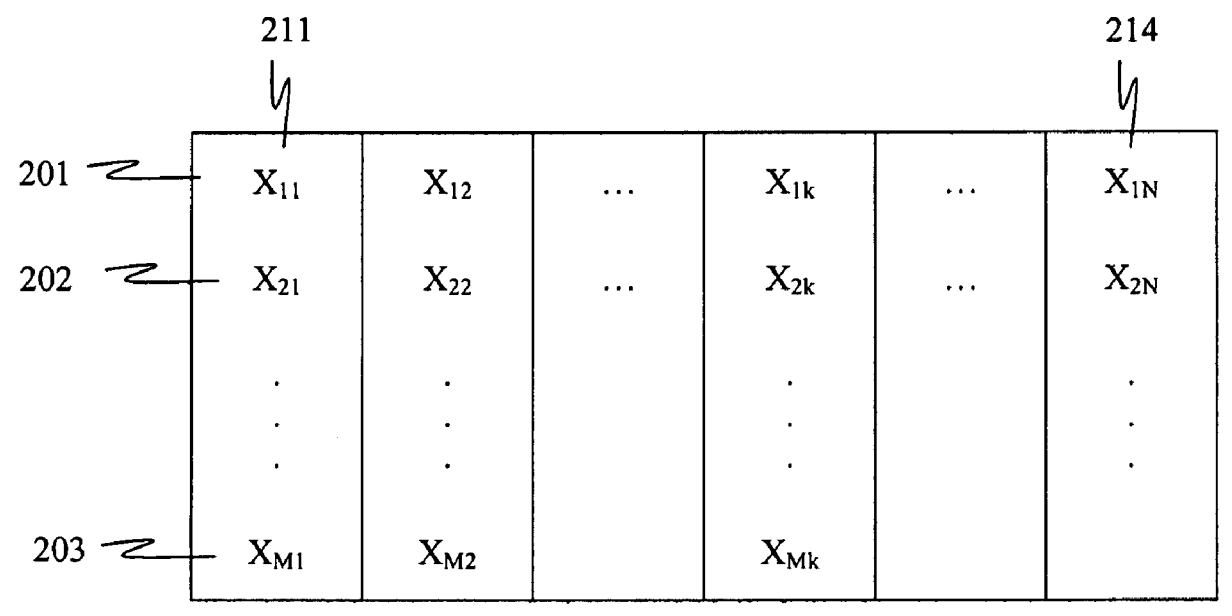

FIG. 2 illustrates a logical representation of a block of data stored in memory 130. Data block X is segmented into symbols $X_{11}$ through $X_{Mk}$. A block of data can be logically described in terms of a matrix. In the present example, data block X has a width N, a depth M, and has k symbols in the last row. As is standard convention, this block of data is denoted as (N, M, k). The size of the data block X is its width multiplied by its depth (i.e., S=N×M). A block of data is considered full if its last row is full (i.e., k=N).

Memory 130 can also be logically represented as a two-dimensional matrix. The memory represented in FIG. 2 is configured for a block interleaver having a width N and a depth M. A block interleaver having this configuration is commonly referred to as an N×M block interleaver.

FIG. 2 may be used to illustrate current techniques for interleaving data in a conventional block interleaver 110. In the conventional interleaver 110, write module 120 writes data symbols from data block X into memory 130 in a row by row fashion, resulting in the creation of M rows. Row 201 represents the first N symbols received and row 203 represents the last k symbols received. The read module 140 then reads the symbols in a column by column fashion starting with the M symbols in the first column 211, then the M symbols in the second column 212, and so on until the symbols in last column 214 are read.

Note that symbol $X_{21}$ stored in column 211, row 202 cannot be read by read module 140 until the entire first row 201 has already been written by write module 120. In effect, all columns except the first column 211 of the block cannot be read until all rows except the last row 203 of the block have been written.

In one conventional technique, write module 120 writes a set of data symbols to a first section 134 of memory 130. Read module 140 then completely reads the symbols from the first section 134 before the next set of symbols can be input into the first memory section 134. This technique reduces memory requirements because the system requires only enough memory to hold a single block of data at a time. However, the throughput of the interleaver is highly bursty.

In another conventional technique, write module 120 writes a set of symbols from a data block to a first section 134 of memory 130. As read module 140 reads a symbol from first section 134, write module 120 writes a symbol from the next data block to a second section 138 of memory 130. The second section of memory 130 is not occupied by the data block currently being output. By alternating reads and writes in this fashion, the interleaver ensures that the write module 120 will never overwrite data stored in memory that has not yet been read by read module 140. This technique allows data to be input and output at a constant rate. However, the memory requirements for the system are significantly increased because the device must maintain memory sufficient to hold at least two blocks of data simultaneously.

A need therefore exists for a block interleaver that can reduce memory overhead while achieving constant latency.

BRIEF SUMMARY OF THE INVENTION

The present invention is directed to a system and method for interleaving data in a communications network. In accordance with embodiments of the present invention, the interleaving system includes an addressable memory that stores data symbols to be interleaved. In addition to the memory, the system includes a write module and a read module coupled to the memory. The system also includes a interleaving logic module for determining the interleaving sequence for symbols in a data block.

In an embodiment of the present invention, when the interleaving system receives a first sequence of symbols, the write module writes the symbols to memory according to an initial sequence of memory addresses provided by the interleaving logic module. For each position in the interleaving sequence, the interleaving logic module determines the memory address to be accessed to obtain the symbol to transmit in that position. The interleaving logic module communicates this address to the read module which reads the symbol from that memory address. The interleaving logic module then communicates the address to the write module. When the write module receives the memory address, the write module writes a symbol from the next sequence of symbols into the memory address vacated. The interleaving logic module repeats this interleaving method for each data block to be interleaved.

The present invention is also directed to a system and method for de-interleaving data in a communications network. In accordance with an embodiment of the present invention, the de-interleaving system includes a block interleaver having a width equal to the depth of the block interleaver which generated the interleaved data sequence. In an embodiment of the invention, when the de-interleaving system receives a first sequence of interleaved symbols, the write module of the receiving block interleaver writes the symbols to memory addresses according to an initial sequence of memory addresses provided by the interleaving logic module. For each position in the interleaving sequence, the interleaving logic module determines the memory address to be accessed to obtain the symbol to transmit in that position. The interleaving logic module communicates this address to the read module and then to the write module. When the write module receives the memory address, the write module writes a symbol from the next sequence of interleaved symbols into the memory address vacated. The interleaving logic module repeats these steps for each data sequence to be de-interleaved.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the pertinent art to make and use the invention.

FIG. 2 is a diagram of an exemplary block of data stored in a conventional system for interleaving data.

FIG. 5 illustrates a method for processing data blocks having smaller dimensions than the block interleaver.

FIGS. 7A, 7B, 7C, and 7D collectively illustrate interleaving of exemplary blocks of data in accordance with embodiments of the present invention.

Figure 8:
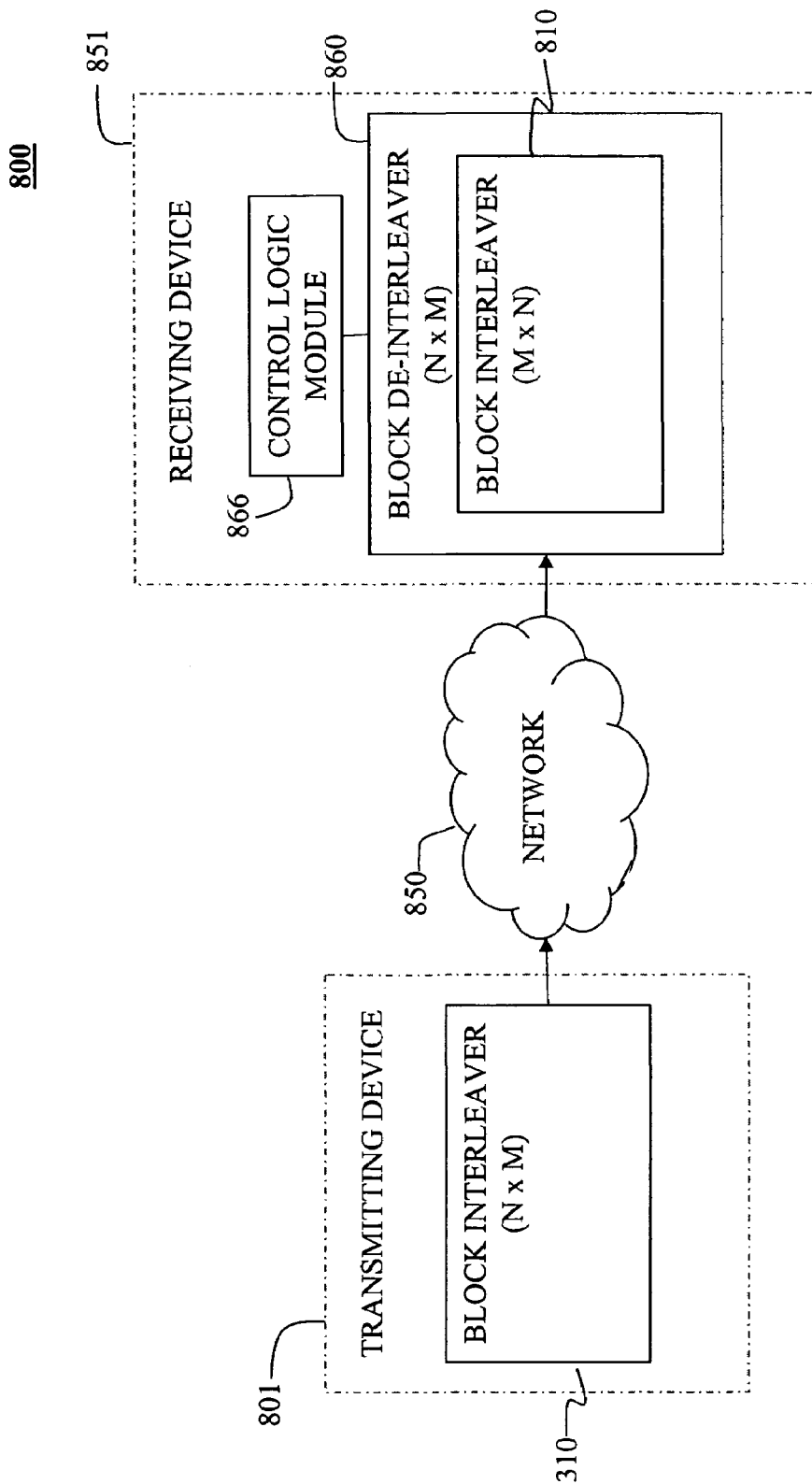

FIG. 8 is a block diagram of a network for interleaving and de-interleaving data in accordance with embodiments of the present invention.

The features and advantages of the present invention will become more apparent from the detailed description set forth below when taken in conjunction with the drawings in which like reference characters identify corresponding elements throughout. In the drawings, like reference numbers generally indicate identical, functionally similar, and/or structurally similar elements. The drawing in which an element first appears is indicated by the leftmost digit in the corresponding reference number.

DETAILED DESCRIPTION OF THE INVENTION

Figure 1:
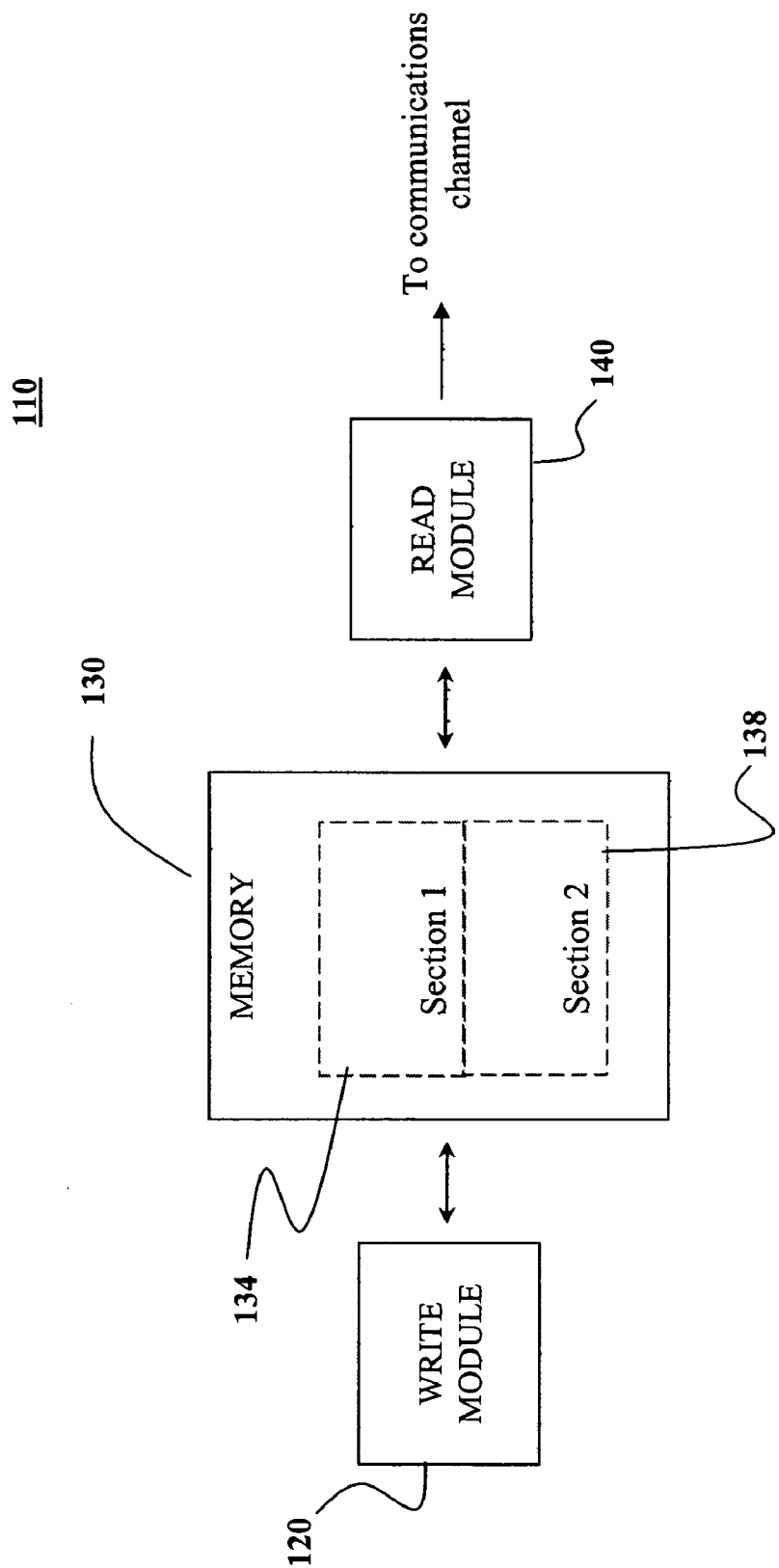
FIG. 1 illustrates a conventional system for interleaving data in a communication device.
Figure 3:
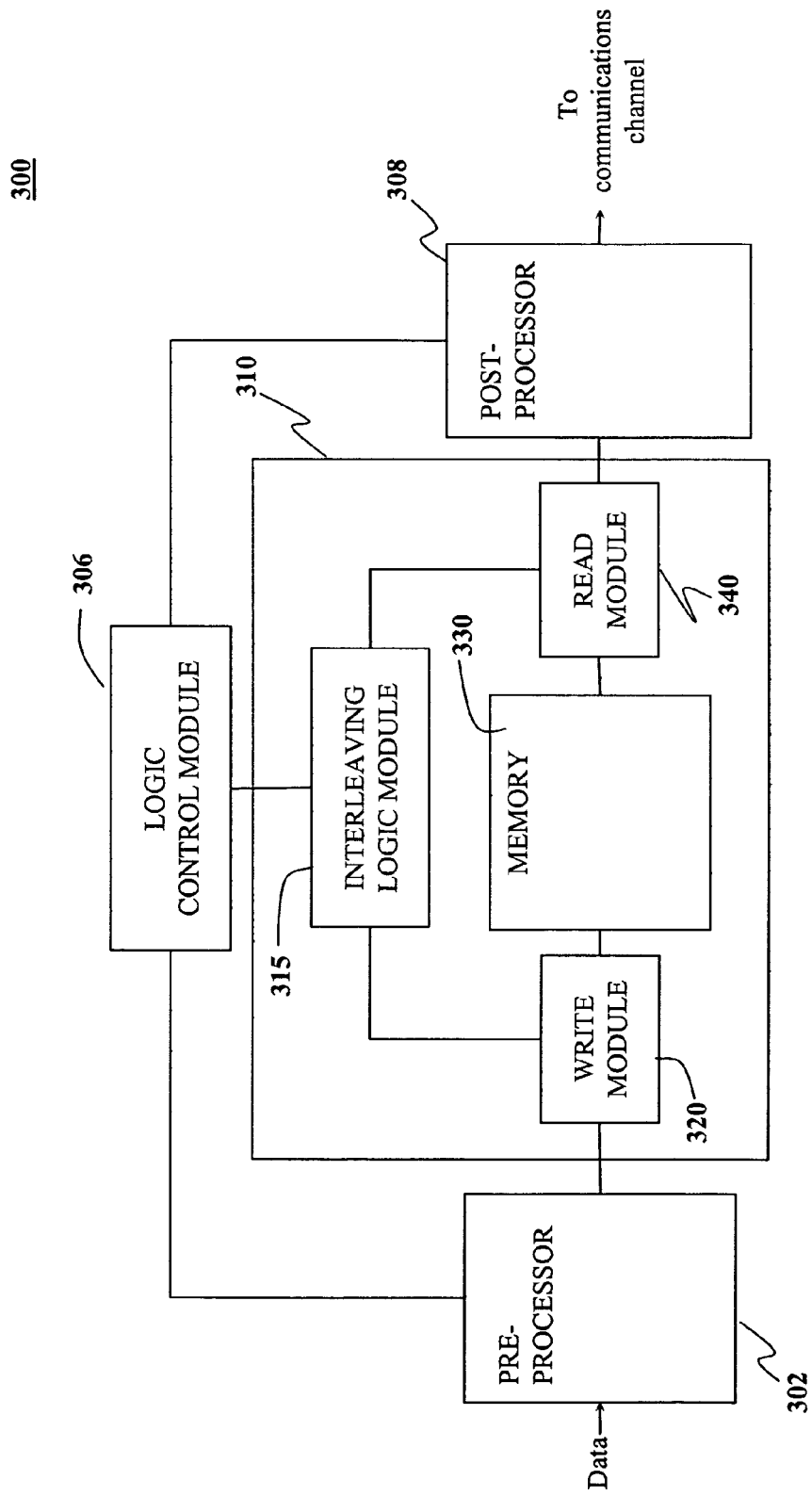
FIG. 3 is a block diagram of a system for interleaving data in a communication device in accordance with embodiments of the present invention.

FIG. 3 illustrates a system for interleaving data in accordance with an embodiment of the present invention. FIG. 3 will be used to describe the structure and operation of system 300. System 300 may be implemented in the transmitter portion of a communications device. Persons skilled in the relevant art(s) will recognize that configurations and arrangements other than those provided in FIG. 3 can be used without departing from the spirit and scope of the present invention.

System 300 is intended to be used to interleave data to minimize the impacts of burst errors. As will be appreciated by persons skilled in the relevant art(s), system 300 can be used in conjunction with other error correction techniques such as Forward Error Correction (FEC) to further minimize errors.

System 300 comprises a preprocessor 302, a control logic module 306, a postprocessor 308, and a block interleaver 310. The preprocessor 302 is configured to receive data and segment the data into symbols for input to the block interleaver 310. The size and format of each data symbol are determined based on the configuration of the block interleaver 310 and the requirements of the communications device. In an embodiment of the present invention, preprocessor 302 is included in block interleaver 310. The control logic module 306 is coupled to the block interleaver 310, the preprocessor 302, and the postprocessor 308. The control logic module 306 comprises logic to configure the block interleaver 310 based on the requirements of the transmitting communications device. In an embodiment of the current invention, control logic module 306 is included in preprocessor 302 or alternatively in block interleaver 310.

The postprocessor 308 formats the output symbols of the interleaver into a data stream for transmission. The size and format of each data symbol are determined based on the configuration of the block interleaver 310 and the requirements of the communications device. In an embodiment of the present invention, postprocessor 308 is included in block interleaver 310.

Block interleaver 310 comprises a write module 320, a memory 330, a read module 340, and interleaving logic module 315. Interleaving logic module 315 is coupled to write module 320 and read module 340. Write module 320 and read module 340 are each coupled to memory 330. In an alternate embodiment of the present invention, write module 320 and read module 340 are also connected by one or more signal lines which carry control information.

Write module 320 comprises logic configured to receive data symbols from preprocessor 302 and write the symbols into specific locations in memory 330 so that the symbols may be interleaved prior to transmission over a communications channel. Although write module 320 is preferably implemented in hardware, persons skilled in the relevant art(s) will appreciate that the functions of write module 320 may be implemented entirely in software or as a combination of hardware and software. In an embodiment of the present invention, write module 320 includes a buffer for temporarily storing received data symbols. Write module 320 utilizes information provided by interleaving logic module 315 to determine into which memory address a specific data symbol from a data block should be written.

Interleaving logic module 315 comprises logic to determine the interleaving sequence for a stored block of data. The interleaving sequence is the output order for symbols stored in memory 330. The interleaving logic module 315 determines the interleaving sequence by calculating a memory address for each position in the interleaving sequence. The memory address contains the symbol to the be read in that position. In an embodiment of the present invention, interleaving logic module 315 is implemented in software. Persons skilled in the relevant art(s) will appreciate that the functions of interleaving logic module can be implemented in hardware or a combination of hardware and software. Further, although interleaving logic module 315 is illustrated as a separate module, interleaving logic module 315 could be implemented as a component of write module 320 or read module 340. Interleaving module 315 is coupled to control logic module 306 for receiving information regarding the configuration of block interleaver 310. For example, the control logic module 306 may indicate that the block interleaver is configured as a 4×3 block interleaver for the current block of data symbols being interleaved.

In an illustrative embodiment, memory 330 comprises a random access memory (RAM). For example, memory 330 may comprise any type of RAM including, but not limited to, a Static Random Access Memory (SRAM), Dynamic Random Access Memory (DRAM), Fast Page Mode Dynamic Random Access Memory (FPM DRAM), Extended Data-out Dynamic Random Access Memory (EDO DRAM), and Synchronous Dynamic Access Memory (SDRAM). However, the invention is not limited to the use of a RAM, and memory 330 may also comprise any type of memory device that provides for the temporary storage of data.

Read module 340 comprises logic that is configured to read symbols written to addressable blocks of memory 320 in an interleaved fashion for transmission over a communications channel. Although read module 340 is preferably implemented in hardware, persons skilled in the relevant art(s) will appreciate that the functions of read module 340 may be implemented entirely in software, or as a combination of hardware and software. Read module 340 utilizes information provided by interleaving logic module 315 to determine from which memory address to read the next symbol to be output.

Figure 4:
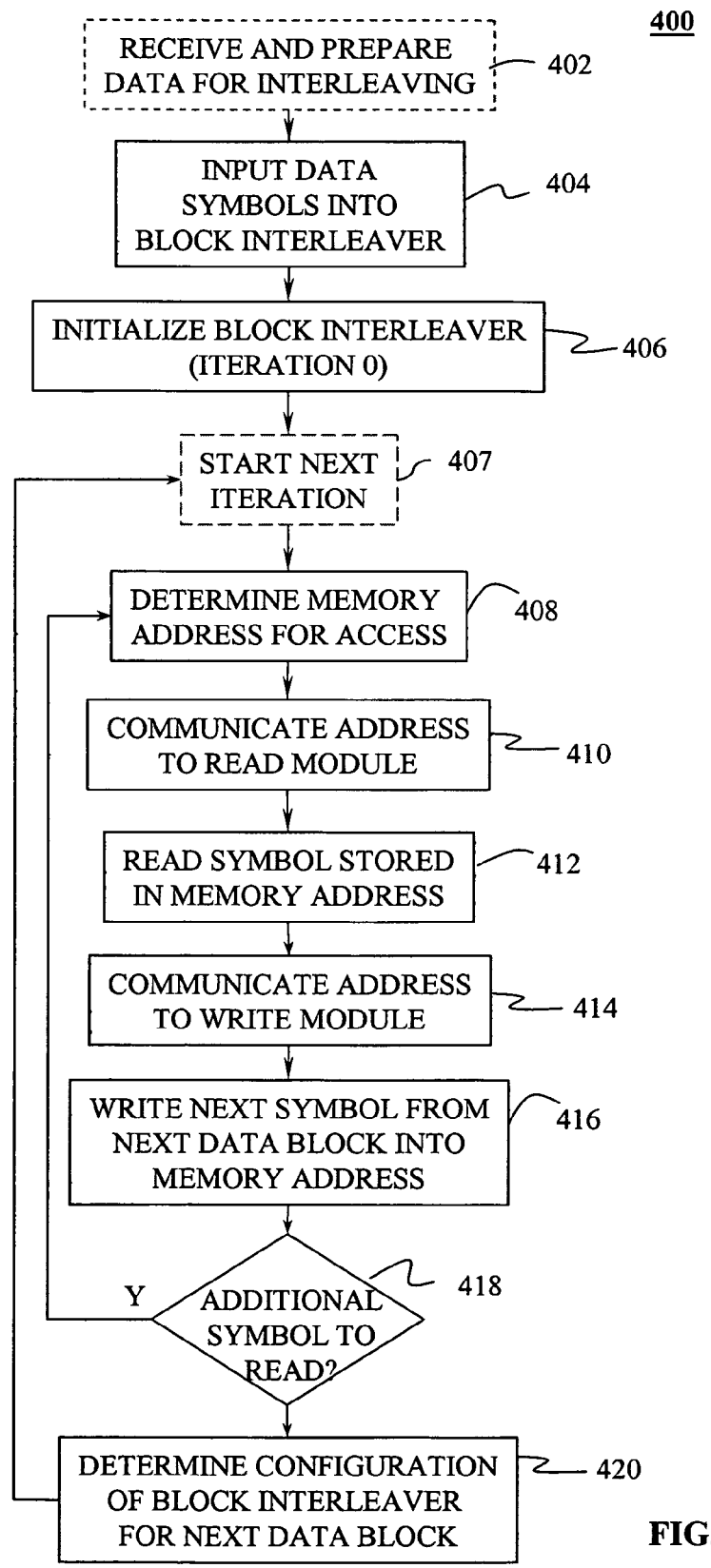
FIG. 4 is a flowchart illustrating a method for interleaving symbols of a data block stored in a memory in accordance with embodiments of the present invention.

FIG. 4 depicts a flowchart 400 of a method for interleaving data in accordance with an embodiment of the present invention. The invention, however, is not limited to the description provided by the flowchart 400. Rather, it will be apparent to persons skilled in the relevant art(s) from the teachings provided herein that other functional flows are within the scope and spirit of the present invention. The flowchart 400 will be described with continued reference to the example interleaving system 300 described in reference to FIG. 3, above. However, the invention is not limited to that embodiment.

The method of flowchart 400 begins at step 402, in which preprocessor 302 receives a stream or burst of data. Prior to step 402, preprocessor 302 receives information from control logic module 306 indicating the configuration of block interleaver 310. The preprocessor 302 uses the information to prepare the data for input into block interleaver 310. In an embodiment of the invention, preprocessor 302 segments the data into multiple data blocks. Each data block is further segmented into one or more symbols. The number of symbols in each data block is set to the size of the block interleaver 310. The size of the interleaver is determined by multiplying the width of the interleaver by its depth. For example, if block interleaver 310 is a 4×3 block interleaver, the preprocessor will segment the received data into blocks having 12 symbols each.

Each data block being prepared by preprocessor 302 may be conceptualized as a matrix, as described above. Each element of the matrix represents a data symbol. When the preprocessor 302 determines that the last row of the matrix is only partially filled (i.e., k does not equal N), the preprocessor 302 pads the remaining symbols in the last row with zeros. The padded symbols will be stripped out prior to outputting the data on the communications channel by postprocessor 308. Alternatively, the preprocessor 302 can communicate to the interleaving logic module 315 that the data block being input has a partial last row. The interleaving logic module 315 can then skip the memory addresses containing padded zeros when performing the interleaving algorithm.

Figure 5:
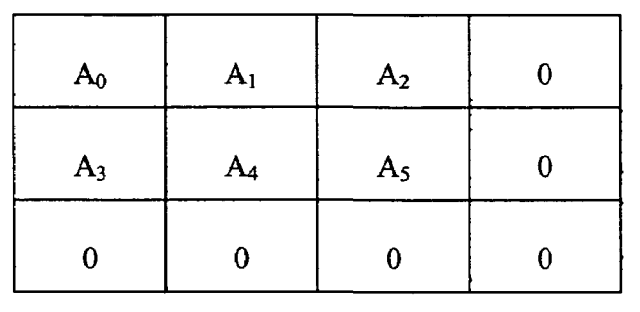

In an alternative embodiment, preprocessor 302 may receive data blocks of varying size. When the preprocessor 302 receives a block of data represented by a matrix with smaller dimensions then the block interleaver 310, the preprocessor 302 extends the data block to fit within a block having the same dimensions as the block interleaver 310. FIG. 5 is a diagram illustrating an exemplary extended data block. In FIG. 5, the preprocessor 302 received a 6 symbol data block with dimensions (3, 2, 3). For purposes of this example, assume that the system is using a 4×3 block interleaver. The symbols of the initial data block are placed in an extended 4×3 matrix in the position they occupy in their current matrix. The preprocessor 302 then pads the last element in the first row with a zero, the last element in the second row with a zero, and the entire last row with zeros. The data block now has 12 symbols and can be input into the block interleaver. The padded zeros in the output of the interleaver are then stripped out by the postprocessor 308 before transmission.

Returning to FIG. 4, in step 404, the preprocessor 302 begins communicating data symbols to the write module 320 of block interleaver 310. Preprocessor 302 will continue to receive and prepare data and communicate symbols to block interleaver 310 throughout the process described in steps 406 through 420. When the write module 320 receives the first symbol, the block interleaver 310 initializes the memory 330 (step 406). This step is referred to as iteration 0. As part of iteration 0, the interleaving logic module 315 instructs the write module 320 to write the symbols contained in the first data block into memory 330 according to the initial write sequence defined for the system. In an illustrative embodiment of the invention, the initial sequence of memory addresses for writing symbols of the first data block is:

$$I_0 = (0, 1, 2, 3, \ldots, S-2, S-1) \text{ where } S=N*M$$

When all the symbols of the first data block are written to memory 330, the next iteration, iteration 1 begins at step 408.

Each successive iteration following iteration 0 involves reading a symbol from a memory address and inputting a symbol from the next available data block into the vacated memory address in an alternating fashion. In steps 408 through 418, the block interleaver generates the interleaving sequence for transmission of the data block stored in memory. The sequence is generated by determining a memory address containing the symbol to be read for each position in the sequence. In step 408, the interleaving logic module 315 determines the memory address to be accessed for the first position in the interleaving sequence. When the memory address to access is determined, the interleaving logic module 315 communicates the memory address to the read module 340 (step 410). Upon receipt of this memory address, the read module 330 reads the symbol stored in that memory address (step 412). In step 414, the interleaving logic module 315 communicates the memory address to write module 320. When the write module 320 receives the memory address, the write module 320 writes a data symbol from the next available data block into the memory address (step 416). The interleaving logic module 315 times the communications to the read and write module to ensure that write module 320 does not write a new symbol into a memory address before the prior symbol has been read.

The interleaving logic module 315 then determines whether any symbols of the current data block remain in memory 320 (step 418). This can also be done by determining if all positions in the interleaving sequence have been filled. The number of positions in the interleaving sequence is equal to the size of the data block. If data remains to be read, the system repeats steps 408 through 418 until all symbols from the current block have been read by read module 330.

In step 420, the interleaving logic module 315 determines the configuration of the block interleaver for the next data block to be read from memory 330. In an embodiment of the present invention, control logic module 306 communicates to the interleaving logic module 315 the block interleaver configuration to use in the next iteration. For example, the control logic module 306 may communicate that the block interleaver has changed from a 4×3 interleaver to a 6×2 interleaver for the next iteration. If no communication is received from the control logic module, the configuration for the block interleaver is presumed to remain the same for the next iteration. The system then begins the next iteration at step 407.

Figure 6A:
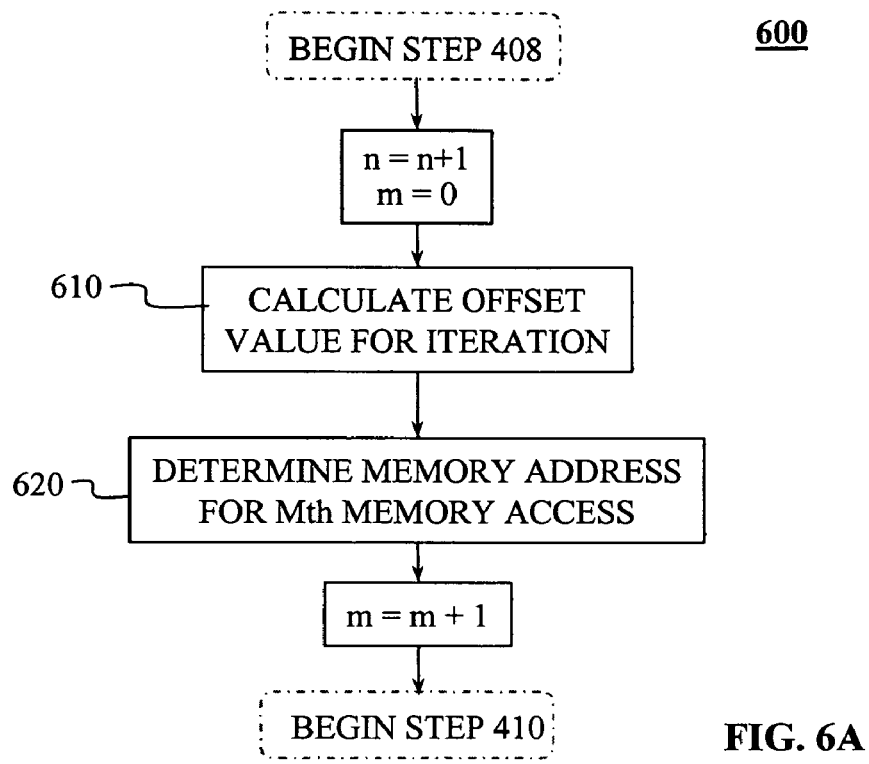
FIG. 6A is a flowchart illustrating a method for determining a memory address for a position in the interleaving sequence in accordance with embodiments of the present invention.

FIG. 6A depicts a flowchart 600 for determining the memory address for an interleaving sequence position in an illustrative embodiment of the present invention. The iteration number is represented by the integer, n. The value of n is incremented prior to calculating the offset value for the current iteration. In step 610, the interleaving logic module 315 determines an offset value, $O_n$, for the current iteration according to the following equation:

$$O_n = N \times O_{n-1} \bmod^*(S-1), \text{where } O_{n-1} \text{ is the offset in the previous iteration.}$$

The operation X mod* Y is a modified version of the standard remainder operation mod. It is defined by:

$$X \bmod^* Y = \{Y \text{ if } X \bmod Y = 0$$

$$\{X \bmod Y \text{ if } X \bmod Y \text{ is not equal to } 0$$

The offset value for iteration 0, $O_0$, is set to 1. In step 620, the interleaving logic module 315 determines the memory address for the current access according to the equation:

$$I_{n,m} = m \times O_n \bmod^*(S-1)$$

The number of memory addresses calculated per iteration (i.e., the number of positions in the interleaving sequence) is equal to the number of symbols in a data block. The integer, m, represents the position in the interleaved data sequence for which a symbol must be read. The value of m ranges from 0 for the first memory address (i.e., first position of interleaved data sequence) to S−1 for the last memory address (i.e., last position of interleaved data sequence). Thus, m is reset to 0 at the start of each iteration. After interleaving logic module 315 determines the memory address, the value of m is incremented by 1. The use of integers n and m is for descriptive purposes only. As would be apparent to one of skill in the relevant art(s), many mechanisms for determining the iteration and sequence position could be implemented in the interleaving logic module 315. Because the first and last access values are always 0 and S−1, respectively, in an alternative embodiment, the interleaving logic module 315 sets these values without performing any calculations.

Figure 6B:
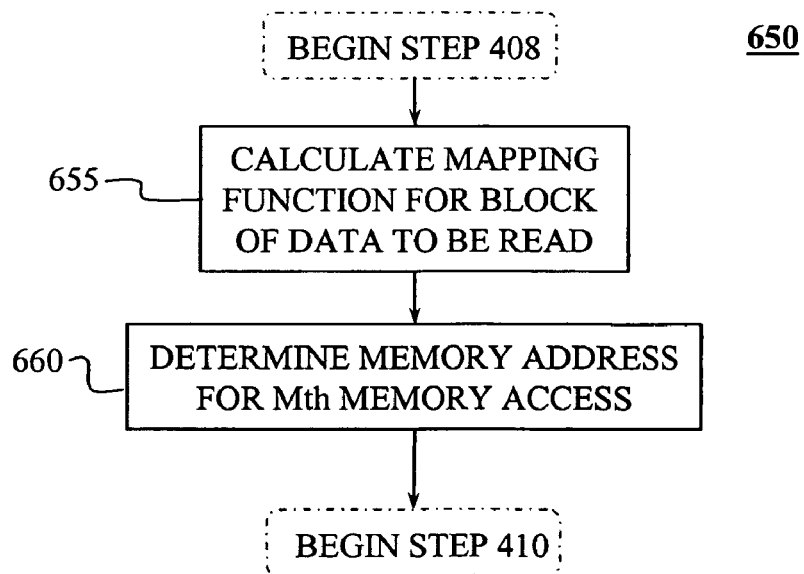
FIG. 6B is a flowchart illustrating an alternative method for determining a memory address for a position in the interleaving sequence in accordance with embodiments of the present invention.

FIG. 6B depicts a flowchart 650 for determining the memory address for an interleaving sequence position in an alternative embodiment of the invention. In step 655, the interleaving logic module 315 calculates values for a mapping function corresponding to the data block being output from memory 320. The mapping function is:

$$F_N(r) = (r \times N) \bmod^*(S-1) \text{ where } r = 0,1,2,\ldots S-1$$

The interleaving logic module 315 then determines the memory address for the current interleaving sequence position (step 660) according to the following equation:

$$I_{n,m} = F_N(I_{n-1,m})$$

where n is the current iteration and n−1 represents the immediately preceding iteration. The integer, m, is used to represent the position in the interleaved data sequence for which a symbol must be read. The use of integers n, m, and r is for descriptive purposes only. As would be apparent to one of skill in the relevant art(s), many mechanisms for determining these parameters could be implemented in the interleaving logic module 315.

FIGS. 7A–D are diagrams of an illustrative memory 730 that may be used to demonstrate the interleaving of exemplary blocks of data in accordance with embodiments of the present invention. For the purpose of this example, assume that preprocessor 302 received four blocks of data (Block A, Block B, Block C, and Block D). In the present example, the block interleaver 310 is configured as a 4×3 block interleaver. Based on these dimensions, the preprocessor 302 divides each data block into 12 symbols. For descriptive purposes, the symbols of Block A are labeled $A_0$ through $A_{11}$.

The illustrative memory 730 is divided into 12 blocks of addressable memory space. The memory address for each block is indicated in the upper left hand corner of the block. Note that the use of integer numbers as memory addresses is for illustrative purposes only. The manner of addressing memory blocks is well known to persons of skill in the relevant art(s).

After Block A is prepared for input into the block interleaver 310, preprocessor 302 communicates the symbols to the write module 320 of the block interleaver 310. The system then starts the initial iteration, iteration 0. In iteration 0, the write module 320 writes the symbols from Block A into the memory to a sequence of memory addresses received from interleaving logic module 315. The initial sequence of memory addresses is defined as:

$$I_0 = (0,1,2,3,4,5,6,7,8,9,10,11)$$

When all the symbols have been written into memory, memory 730 is configured as shown in FIG. 7A. Note that the division of data elements into rows is a logical construct, and may bear no relation to the physical layout of memory addresses in memory 730.

When all the symbols from Block A have been written in memory 730, the block interleaver 310 begins iteration 1. In iteration 1, interleaving logic module 315 determines the memory address for the current interleaving sequence position using one of the two methods described above. For example, if the offset method described above in regards to FIG. 6A is used, then interleaving logic module 315 first determines the offset value for iteration 1 according to the following equation:

$$O_1 = (N \times O_0) \bmod^*(S-1) = 4 \times 1 \bmod^* 11 = 4$$

The interleaving logic module 315 then calculates the memory address for the first position (m=0) according to the equation:

$$I_{1,0} = (0 \times O_1) \bmod^* 11 = 0$$

The interleaving logic module 315 communicates memory address 0 to the read module 340. The read module 340 then reads the symbol stored in address 0. The interleaving logic module 315 then communicates to the write module 320 that memory address 0 is available for writing to. Write module 320 then writes the first symbol from Block B, $B_0$, to memory address 0. The interleaving logic module 315 then determines whether any elements from Block A remain in memory 730. In this example, because 11 elements still remain in memory, the interleaving logic module 315 then identifies the next memory address to be accessed according to the equation:

$$I_{1,1}=(1 \times O_1) \bmod * 11=4$$

The interleaving logic module 315 communicates memory address 4 to the read module 340 which reads the symbol stored in address 4. The interleaving logic module 315 then communicates to the write module 320 that memory address 4 is available for writing to. Write module 320 then writes the second symbol from Block B, $B_1$, to memory address 4. These steps are repeated until all the symbols from Block A have been read.

When all the symbols from Block A have been read from memory and the symbols from Block B written into memory, the system determines the configuration of the block interleaver for the next iteration. In the present example, the configuration remains the same for iteration 2. At the start of iteration 2, memory 730 is configured as shown in FIG. 7B. In iteration 2, interleaving logic module 315 determines the offset value for iteration 2 according to the following equation:

$$O_2=(N \times O_1) \bmod *(S-1)=4 \times 4 \bmod *11=5$$

The interleaving logic module 315 then calculates the memory address for the first access (m=0) according to the equation:

$$I_{2,0}=(0 \times O_2) \bmod *11=0$$

The interleaving logic module 315 communicates memory address 0 to the read module 340 which reads the symbol stored in address 0. The interleaving logic module 315 then communicates to the write module 320 that memory address 0 is available for writing to. Write module 320 then writes the first symbol from Block C, $C_0$, to memory address 0. The interleaving logic module 315 then determines whether any elements from Block B remain in memory 730. In this example, because 11 elements still remain in memory, the interleaving logic module 315 then identifies the next memory address to access according to the equation:

$$I_{2,1}=(1 \times O_2) \bmod *11=5$$

The interleaving logic module 315 communicates memory address 5 to the read module 340. The read module 340 then reads the symbol stored in address 5. The interleaving logic module 315 then communicates to the write module 320 that memory address 5 is available for writing to. Write module 320 then writes the second symbol from Block C, $C_1$, to memory address 5. These steps are repeated until all the symbols from Block B have been read.

When all the symbols from Block B have been read from memory and the symbols from Block C written into memory, the system determines the configuration for the block interleaver for iteration 3. In the present example, the block interleaver is changed to a 6×2 block interleaver for iteration 3. At the start of iteration 3, memory 730 is configured as shown in FIG. 7B. In iteration 3, interleaving logic module 315 determines the offset value for iteration 3 as:

$$O_3=(N \times O_2) \bmod *(S-1)=6 \times 5 \bmod *11=8$$

Because m=0, the memory address for the first access (m=0) in iteration 3 is also 0. The interleaving logic module 315 communicates memory address 0 to the read module 340. The read module 340 then reads the symbol stored in address 0. The interleaving logic module 315 then communicates to the write module 310 that memory address 0 is available for writing to. Write module 320 then writes the first symbol from Block D, $D_0$, to memory address 0. The interleaving logic module 315 then determines whether any elements from Block C remain in memory 730. In this example, because 11 elements still remain in memory, the interleaving logic module 315 then identifies the next memory address to access according to the equation:

$$I_{2,1}=(1 \times O_2) \bmod *11=8$$

The interleaving logic module 315 communicates memory address 8 to the read module 340. The read module 340 then reads the symbol stored in address 8. The interleaving logic module 315 then communicates to the write module 320 that memory address 8 is available for writing to. Write module 320 then writes the second symbol from Block D, $D_1$, to memory address 8. These steps are repeated until all the symbols from Block C have been read. When all data elements from Block C are read, memory 720 is configured as shown in FIG. 7D.

FIG. 8 shows an illustrative communications system 800 for interleaving and de-interleaving data in accordance with the present invention. Communications system 800 includes a transmitting device 801, a network 850, and a receiving device 851. The transmitting device 801 may be a standalone device or may be integrated in a communications device. For example, a communications device may include both a transmitting device 801 and a receiving device 851. The transmitting device 801 includes an N×M block interleaver 310. The structure and operation of the N×M block interleaver 310 is described above. The transmitting device 801 also includes a preprocessor and control logic module which are not shown in FIG. 8. The transmitting device 801 communicates data symbols to the network 850 in an interleaved sequence generated by block interleaver 310.

The network 850 is any type of medium capable of transmitting data. The type of network 850 used in system 800 will depend on the application in which the transmitting and receiving devices are operating. For example, if the system is a wireless system, the network will include wireless network components such as base stations and switches.

The receiving device 851 receives the interleaved symbols from the network 850. Receiving device 851 is complementary to transmitting device 801. The receiving device 851 may be a standalone device or may be integrated in a communications device. Receiving device 851 includes a control logic module 866 and an N×M block de-interleaver 860. In an alternate embodiment, receiving device 851 also includes a preprocessor for receiving and processing the data prior to communication to the block de-interleaver.

The block de-interleaver 860 is configured to be the same dimension and size as the block interleaver 310 in the complementary transmitting device 801. The N×M block de-interleaver 860 is implemented as an M×N block interleaver 810. The receiving block interleaver 810 has a width, M, equal to the depth of the transmitting block interleaver 310 and a depth, N, equal to the width of the transmitting block interleaver 310. The transmitting and receiving block interleavers are the same size. The block interleaver 810 has the same structure and operation as described above for the block interleaver 310, with the exception that a partial last row in 310 is treated as a partial last column in 810.

When block de-interleaver 860 receives the first block of interleaved symbols, the block de-interleaver 860 inputs the symbols into the block interleaver 810. The block interleaver 810 then performs the interleaving steps described above in relation to FIG. 4. This interleaving of the received interleaved data blocks according to the present invention results in the generation of the initial data sequence.

While various embodiments of the present invention have been described above, it should be understood that they have been presented by way of example, and not limitation. It will be apparent to persons skilled in the relevant art(s) that various changes in form and detail can be made therein without departing from the spirit and scope of the invention. Thus, the present invention should not be limited in any of the above-described exemplary embodiments, but should be defined only in accordance with the following claims and their equivalents.

What is claimed is:

1. A system for interleaving data in a communications device, wherein the data is comprised of a plurality of data blocks, each block having a plurality of symbols, the system comprising:
   a memory segmented into a plurality of addressable memory blocks, each memory block having a unique address;
   a write module coupled to the memory, the write module configured to write symbols to the addressable memory blocks;
   a read module coupled to the memory, the read module configured to read symbols from the addressable memory blocks in an interleaved fashion;
   means for determining an interleaving sequence for transmitting symbols of a stored data block wherein the interleaving sequence includes a sequence of memory addresses; and
   means for sequentially communicating each memory address in the interleaving sequence to the read module first and then to the write module;
   wherein said read module is further configured to receive the memory address and to read the symbol stored in the memory address; and
   wherein said write module is further configured to receive the memory address and to write a symbol from a next block of data to the memory address.

2. The system of claim 1 wherein each memory address in the interleaving sequence is determined using an offset value wherein the offset value is calculated using the dimensions of the interleaver.

3. The system of claim 1 wherein each memory address in the interleaving sequence is determined using a mapping function wherein the mapping function is calculated using the dimensions of the interleaver.

4. The system of claim 1 further comprising a control module coupled to the determining means.

5. The system of claim 1 further comprising a preprocessor coupled to the write module.

6. A method for interleaving data in a communications device including a block interleaver, wherein the data comprises a plurality of data blocks, each data block having a plurality of symbols, the method comprising the steps of:
   (a) writing symbols from a first data block into an addressable memory according to an initial sequence of memory addresses;
   (b) determining dimensions of the block interleaver for a current iteration;
   (c) determining a memory address for a current position in an interleaving sequence wherein the number of positions in the sequence is equal to the size of a stored data block;
   (d) reading the symbol stored in the determined memory address;
   (e) writing a symbol from a next data block in the determined memory address;
   (f) repeating steps (d) through (f) until all symbols of a stored data block have been read from memory; and
   (g) repeating steps (b) through (g) until all data blocks have been transmitted by the communication device.

7. The method of claim 6 wherein the step of determining a memory address for a current position in the interleaving sequence further comprises the steps of:
   (a) determining an offset value for the interleaving sequence, wherein the offset value is computed as $O_n = N \times O_{n-1} \mod^*(S-1)$ wherein the variable N is a width of the block interleaver, S is a size of the block interleaver and $O_{n-1}$ is an offset of an immediately previous iteration; and
   (b) determining a memory address to access, wherein the memory address is computed as $I_{n,m} = m \times O_n \mod^*(S-1)$ wherein the variable m is the position in the interleaved data sequence for which a symbol is to be read.

8. The method of claim 6 wherein the communications device further includes a preprocessor.

9. The method of claim 6 wherein the communications device further includes a control module.

10. The method of claim 9 further comprising the step of:
    (a) receiving block interleaver configuration information to be used in determining the current interleaving sequence from the control module.

11. A system for de-interleaving data in a communications device, wherein the data is comprised of a plurality of data blocks, each block having a plurality of interleaved data symbols, the system comprising:
    a receiving block interleaver configured to have a width equal to the depth of a block interleaver which generated the plurality of interleaved symbols, the receiving block interleaver comprising:
    a memory segmented into a plurality of memory blocks, each memory block having a unique address;
    a write module coupled to the memory, the write module configured to write symbols to the addressable memory blocks;
    a read module coupled to the memory; the read module configured to read symbols from the addressable memory blocks in a de-interleaved fashion;
    means for determining an interleaving sequence for transmitting symbols of a stored data block wherein the interleaving sequence includes a sequence of memory addresses; and
    means for sequentially communicating each memory address in the interleaving sequence to the read module first and then to the write module;
    wherein said read module is further configured to receive the memory address and to read the symbol stored in the memory address; and
    wherein said write module is further configured to receive the memory address and to write a symbol from a next block of data to the memory address.

12. The system of claim 11 wherein each memory address in the interleaving sequence is determined using an offset value wherein the offset value is calculated using the dimensions of the interleaver.

13. The system of claim 11 wherein each memory address in the interleaving sequence is determined using a mapping function wherein the mapping function is calculated using the dimensions of the interleaver.

14. The system of claim 11 further comprising a control module coupled to the determining means.

15. The system of claim 11 further comprising a preprocessor coupled to the write module.

16. A method for de-interleaving a block of interleaved data symbols in a receiving communications device including a block de-interleaver, wherein the data is received from a transmitting communications device having a block interleaver which generated the interleaved data sequence and wherein the block de-interleaver includes a receiving block interleaver having a width equal to a depth of the generating block interleaver, the method comprising the steps of:
  (a) writing symbols from a first sequence of interleaved symbols into an addressable memory according to an initial sequence of memory address accesses;
  (b) determining dimensions of the receiving block interleaver for a current iteration;
  (c) determining a memory address for a current position in an interleaving sequence wherein the number of positions in the sequence is equal to the size of a stored data block;
  (d) reading the symbol stored in the determined memory address;
  (e) writing a symbol from a next data block in the determined memory address;
  (f) repeating steps (d) through (f) until all symbols of a stored interleaved data block have been read from memory; and
  (g) repeating steps (b) through (g) until all received data blocks have been de-interleaved by the communication device.

17. The method of claim 16 wherein the step of determining a memory address for a current position in the interleaving sequence further comprises the steps of:
  (a) determining an offset value for the interleaving sequence, wherein the offset value is computed as $O_n = N \times O_{n-1} \mod^*(S-1)$ wherein the variable N is a width of the receiving block interleaver, S is a size of the receiving block interleaver and $O_{n-1}$ is an offset of an immediately previous iteration; and
  (b) determining a memory address to access, wherein the memory address is computed as $I_{n,m} = m \times O_n \mod^*(S-1)$ wherein the variable m is the position in the interleaved data sequence for which a symbol is to be read.

18. The method of claim 16 wherein the receiving communications device further includes a preprocessor.

19. The method of claim 16 wherein the receiving communications device further includes a control module.

20. The method of claim 19 further comprising the step of:
  (a) receiving configuration information for the receiving block interleaver to be used in determining the current interleaving sequence from the control module.

* * * * *